United States Patent
Kuczynski et al.

(10) Patent No.: US 8,230,592 B2
(45) Date of Patent: Jul. 31, 2012

(54) METHOD FOR VIA STUB ELIMINATION

(75) Inventors: Joseph Kuczynski, Rochester, MN (US); Kevin Albert Splittstoesser, Stewartville, MN (US); Timothy Jerome Tofil, Rochester, MN (US); Paul Alan Vermilyea, Rochester, MN (US)

(73) Assignee: International Business Machines Corporation, Armonk, NY (US)

( * ) Notice: Subject to any disclaimer, the term of this patent is extended or adjusted under 35 U.S.C. 154(b) by 949 days.

(21) Appl. No.: 12/193,837

(22) Filed: Aug. 19, 2008

(65) Prior Publication Data

US 2010/0044095 A1    Feb. 25, 2010

(51) Int. Cl.
*H01K 3/10* (2006.01)
(52) U.S. Cl. .................. 29/852; 29/830; 29/832
(58) Field of Classification Search .......... 29/830, 29/832, 852
See application file for complete search history.

(56) References Cited

U.S. PATENT DOCUMENTS

| | | | |
|---|---|---|---|
| 4,448,804 A | | 5/1984 | Amelio et al. |
| 4,642,160 A | * | 2/1987 | Burgess .................. 216/18 |
| 5,342,207 A | | 8/1994 | Sobhani |
| 5,736,679 A | * | 4/1998 | Kresge et al. ............. 174/250 |
| 5,979,044 A | | 11/1999 | Sumi et al. |
| 6,021,564 A | * | 2/2000 | Hanson .................. 29/852 |
| 6,207,351 B1 | | 3/2001 | Cywar et al. |
| 6,810,583 B2 | * | 11/2004 | Carpenter et al. ........ 29/852 |
| 7,500,306 B2 | * | 3/2009 | Carpenter et al. ........ 29/852 |

OTHER PUBLICATIONS

Franz Gizin et al., "Overview of Backdrilling", Sanmina-SCI Corp., San Jose, California, <http://www.sanmina.com/Solutions/pdfs/pcbres/Backdrilling.pdf.>.

* cited by examiner

*Primary Examiner* — Carl Arbes
(74) *Attorney, Agent, or Firm* — Matthew J. Bussan

(57) ABSTRACT

An enhanced mechanism is disclosed for via stub elimination in printed wiring boards (PWBs) and other substrates. In one embodiment, the substrate includes a plurality of insulator layers and internal conductive traces. First and second through-holes extend completely through the substrate and respectively pass through first and second ones of the internal conductive traces, which are at different depths within the substrate. Photolithographic techniques are used to generate plated-through-hole (PTH) plugs of controlled, variable depth in the through-holes before first and second conductive vias are respectively plated onto the first and second through-holes. The depth of these PTH plugs is controlled (e.g., using a photomask and/or variable laser power) to prevent the first and second conductive vias from extending substantially beyond the first and second internal conductive traces, respectively, and thereby prevent via stubs from being formed in the first place. This advantageously eliminates the costly and time consuming process of via stub backdrilling.

11 Claims, 6 Drawing Sheets

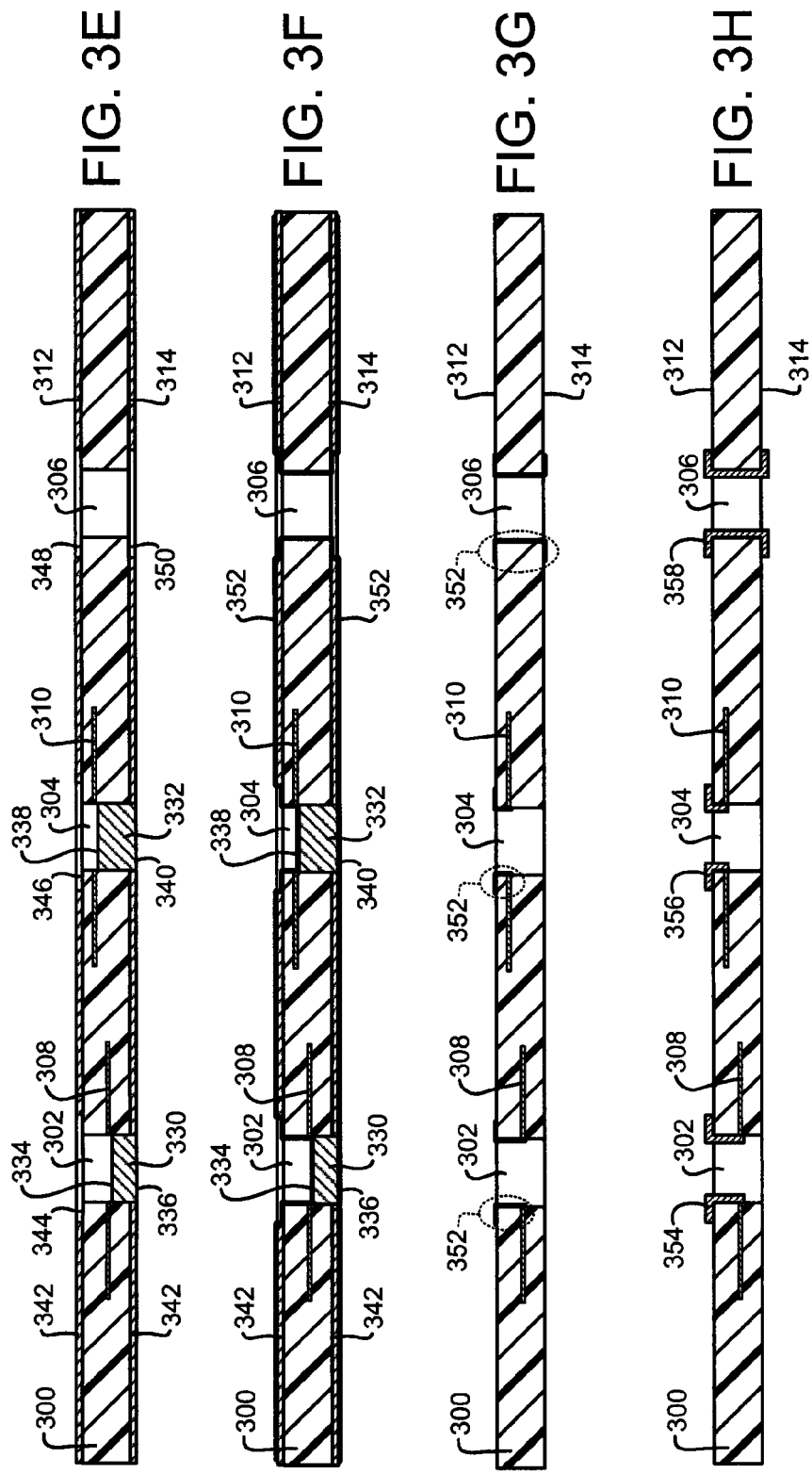

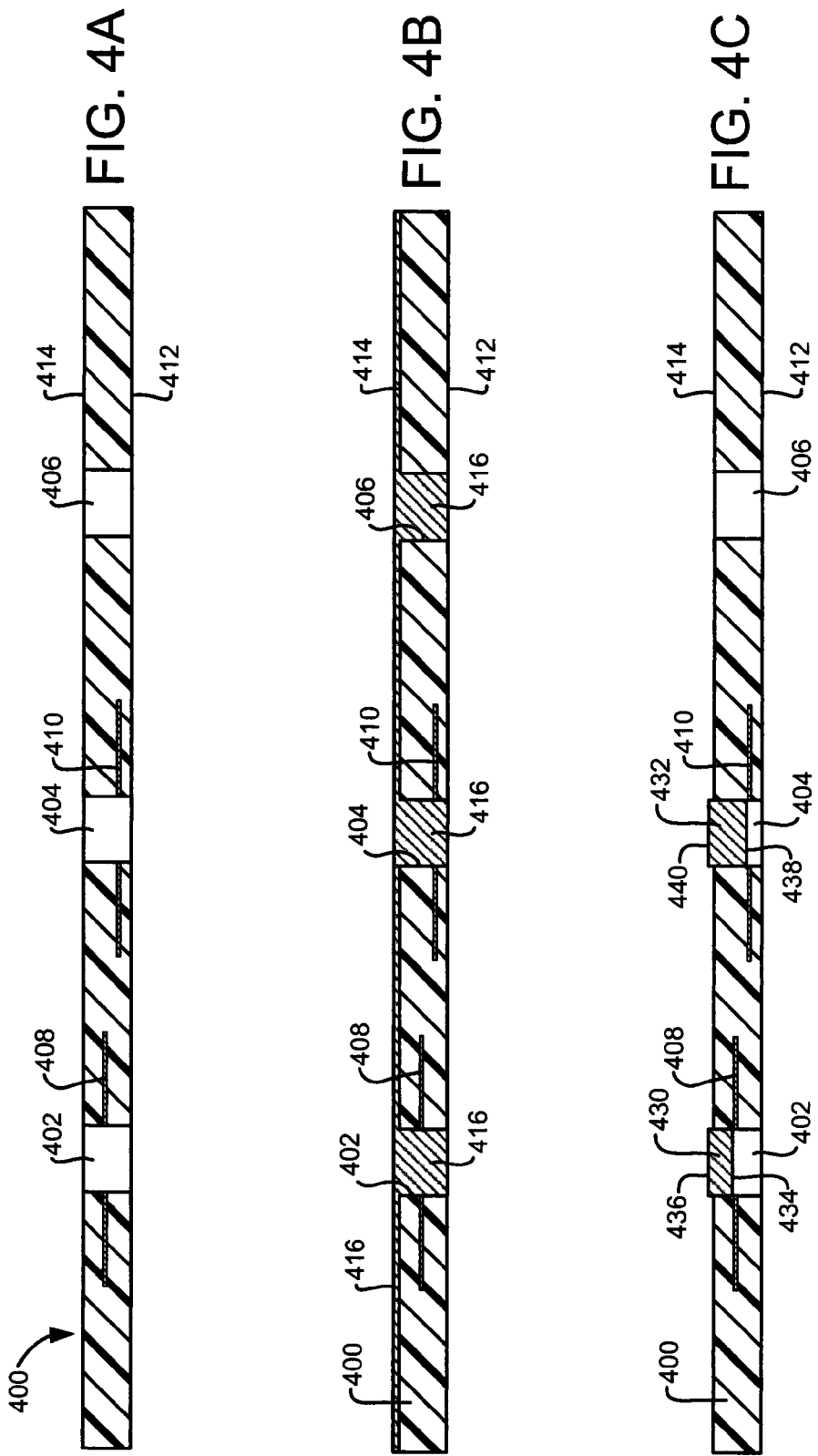

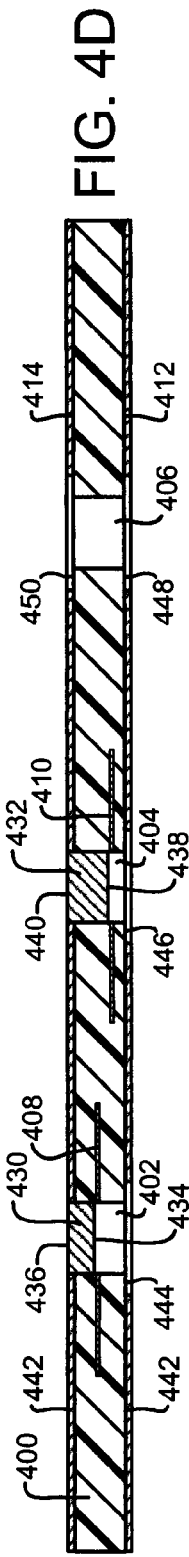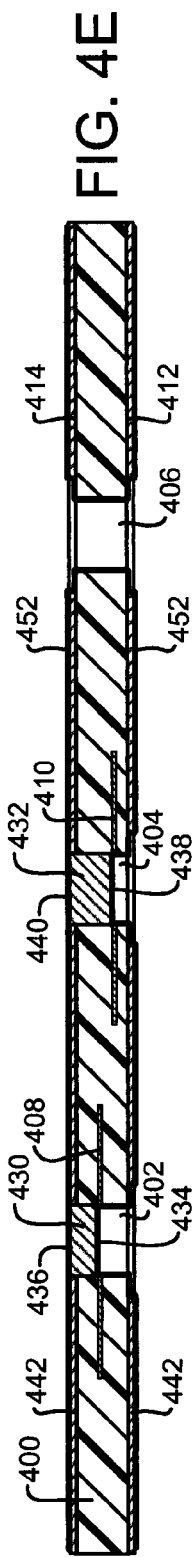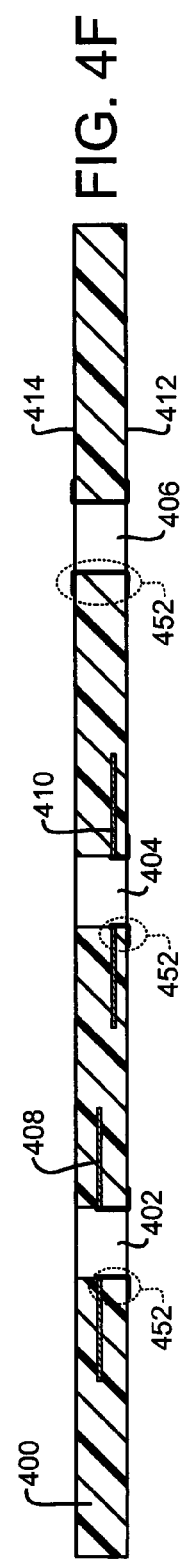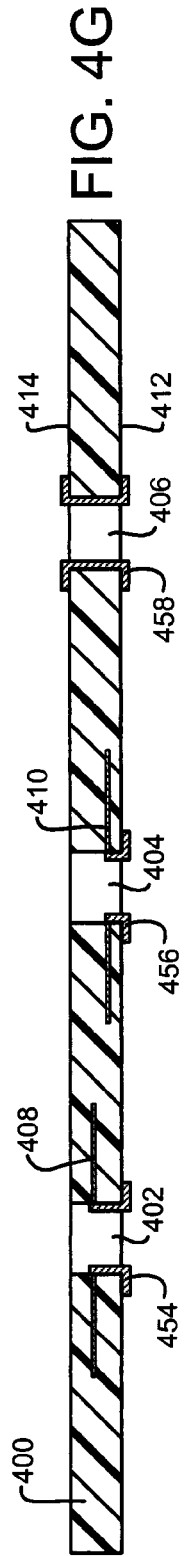

METHOD FOR VIA STUB ELIMINATION

CROSS-REFERENCE TO RELATED APPLICATION

This patent application is related to pending U.S. patent application Ser. No. 12/193,842, filed concurrently, entitled "HORIZONTALLY SPLIT VIAS", which is assigned to the assignee of the instant application, and which is incorporated herein by reference in its entirety.

BACKGROUND OF THE INVENTION

1. Field of Invention

The present invention relates in general to the electrical connector field. More particularly, the present invention relates to a method and apparatus for eliminating a via stub in printed wiring boards (PWBs) and other substrates, such as interconnect substrates.

2. Background Art

Electrical connectors are in widespread use in the electronics industry. In many computer and other electronic circuit structures, an electronic module such as a central processor unit (CPU), memory module, application-specific integrated circuit (ASIC) or other integrated circuit, must be connected to a printed wiring board (PWB). Printed wiring boards are also known as printed circuit boards (PCBs). When populated with one or more electronic components, a printed wiring board is often referred to as a printed wiring board assembly (PWBA) or a printed circuit board assembly (PCBA). In connecting an electronic module to a PWB, individual electrical contacts on the base of the electronic module must be connected to a plurality of corresponding individual electrical contacts on the PWB. This set of contacts on the PWB dedicated to contacting the electronic module contacts is known as a land grid array (LGA) site when a LGA connector is used to connect the electronic module to the PWB.

Typically, the PWB contains a plurality of vias, each electrically connecting a conductive trace on one layer of the PWB to one or more conductive traces on one or more other layers of the PWB. The vias may be at the LGA site, for example, or elsewhere on the PWB. FIG. 1 illustrates exemplary types of conventional vias in a cross-section of a PWB 100 having a plurality of insulator layers 102 and conductive traces 104. Typically, vias are electroplated (e.g., copper or other highly conductive metal) onto through-holes drilled into the PWB. Such a via, which extends from one surface of the PWB to the other surface of the PWB, is referred to as a plated-through-hole (PTH) via. An exemplary PTH via 110 is illustrated in FIG. 1. In addition to or in lieu of PTH vias, it is also not uncommon for high layer-count PWBs to have blind vias, which are visible only on one surface of the PWB, and/or buried vias, which are visible on neither surface of the PWB. An exemplary blind via 120 is illustrated in FIG. 1, as well as an exemplary buried via 130. Blind vias and buried vias are advantageous over PTH vias in certain respects (e.g., blind vias and buried vias are more efficient from a space utilization perspective than PTH vias, and unlike PTH vias, neither blind vias nor buried vias possess via stubs, which as discussed in more detail below, can significantly distort high speed digital signals that pass through PTH vias). However, blind vias and buried vias are significantly more expensive to fabricate than PTH vias because blind vias and buried vias are produced utilizing additional fabrication steps that are performed as the insulator layers of the PWB are fabricated.

As mentioned above, PTH vias possess via stubs that can significantly distort high speed digital signals that pass through PTH vias. This distortion is often severe and generally increases as the data rate increases. FIG. 2 illustrates a cross-section of a PWB 200 with an exemplary conventional PTH via 210 having a via stub 212 and an exemplary conventional backdrilled PTH via 220. The PWB 200 shown in FIG. 2 has a plurality of insulator layers 202, upper conductive traces 204, and intermediate conductive traces 206. The via stub 212 shown in FIG. 2 is the portion of the PTH via 210 that is not connected in the circuit between an upper conductive trace 204 (or contact-pad-portion of the PTH via 210) and an intermediate conductive trace 206.

A conventional technique known as backdrilling can be used to remove the via stub 212, which serves no useful function in this circuit. Backdrilling uses controlled depth drilling techniques to remove the undesired conductive plating in the via stub region. Typically, the via stub region is removed using a drill bit slightly larger in diameter than the drill bit that was used to create the original via hole. See, for example, the discussion of backdrilling via stubs in the publication of Franz Gisin & Alex Stepinski, "Overview of Backdrilling", Sanmina-SCI Corp., San Jose, Calif., http://www.sanmina.com/Solutions/pdfs/pebres/Backdrilling.pdf. An exemplary conventional backdrilled PTH via 220 having a backdrilled region 222 is illustrated in FIG. 2. As described in the Gisin & Stepinski publication, decreasing via stub length by backdrilling significantly reduces a particularly problematic form of signal distortion known as deterministic jitter. Because bit error rate (BER) is strongly dependent on deterministic jitter, any reduction in deterministic jitter by backdrilling will significantly reduce the overall BER of an interconnect—often by orders of magnitude. The Gisen & Stepinski publication also lists other key advantages to backdrilling PTH vias including: less signal attenuation due to improved impedance matching; increased channel bandwidth; reduced EMI/EMC radiation from the end of the via stub; reduced excitation of resonance modes, and reduced via-to-via crosstalk. Unfortunately, backdrilling is a costly, time-consuming process.

It should therefore be apparent that a need exists for an enhanced mechanism for via stub elimination in PWBs and other substrates, such as interconnect substrates.

SUMMARY OF THE INVENTION

According to the preferred embodiments of the present invention, a substrate (e.g. a printed wiring board or other substrate, such as an interconnect substrate) includes a plurality of insulator layers and internal conductive traces. First and second through-holes extend completely through the substrate and respectively pass through first and second ones of the internal conductive traces, which are at different depths within the substrate. Photolithographic techniques are used to generate plated-through-hole (PTH) plugs of controlled, variable depth in the through-holes before first and second conductive vias are respectively plated onto the first and second through-holes. The depth of these PTH plugs is controlled (e.g., using a photomask and/or variable laser power) to prevent the first and second conductive vias from extending substantially beyond the first and second internal conductive traces, respectively, and thereby prevent via stubs from being formed in the first place. This advantageously eliminates the costly and time consuming process of via stub backdrilling.

The foregoing and other features and advantages of the present invention will be apparent from the following more particular description of the preferred embodiments of the present invention, as illustrated in the accompanying drawings.

BRIEF DESCRIPTION OF THE DRAWINGS

The preferred exemplary embodiments of the present invention will hereinafter be described in conjunction with the appended drawings, where like designations denote like elements.

FIGS. 3A-3H illustrate successive stages in a first exemplary method of fabricating one or more stub-less vias in a printed wiring board (PWB) in accordance with the preferred embodiments of the present invention.

FIG. 3A illustrates an initial PWB stage in the first exemplary method of fabricating one or more stub-less vias in a printed wiring board (PWB) in accordance with the preferred embodiments of the present invention. FIG. 3A is a partial, sectional view of an exemplary PWB having a plurality of through-holes.

FIG. 3B is a partial, sectional view of the PWB stage shown in FIG. 3A after a liquid, positive tone photoresist is applied thereto in accordance to the preferred embodiments of the present invention.

FIG. 3C is a partial, sectional view of the PWB stage shown in FIG. 3B after photomasks are placed over upper and lower surfaces thereof in accordance with the preferred embodiments of the present invention.

FIG. 3D is a partial, sectional view of the PWB stage shown in FIG. 3C after having been exposed and developed to form plated-through-hole (PTH) plugs of varying depths in the through-holes of the PWB in accordance with the preferred embodiments of the present invention.

FIG. 3E is a partial, sectional view of the PWB stage shown in FIG. 3D after a seed photoresist is applied thereto, exposed, and then developed to open up the through-holes for subsequent seed material application in accordance to the preferred embodiments of the present invention.

FIG. 3F is a partial, sectional view of the PWB stage shown in FIG. 3E after seed material is applied thereto in accordance with the preferred embodiments of the present invention.

FIG. 3G is a partial, sectional view of the PWB stage shown in FIG. 3F after the seed photoresist and the PTH plugs are stripped therefrom in accordance with the preferred embodiments of the present invention.

FIG. 3H is a partial, sectional view of the PWB stage shown in FIG. 3G after vias are plated onto the seed material remaining thereon in accordance with the preferred embodiments of the present invention. FIG. 3H illustrates a final PWB stage of the successive stages in the first exemplary method of fabricating one or more stub-less vias in a PWB illustrated in FIGS. 3A-3H.

FIGS. 4A-4G illustrate successive stages in a second exemplary method of fabricating one or more stub-less vias in a printed wiring board (PWB) in accordance with the preferred embodiments of the present invention.

FIG. 4A illustrates an initial PWB stage in the second exemplary method of fabricating one or more stub-less vias in a printed wiring board (PWB) in accordance with the preferred embodiments of the present invention. FIG. 4A is a partial, sectional view of an exemplary PWB having a plurality of through-holes.

FIG. 4B is a partial, sectional view of the PWB stage shown in FIG. 4A after a liquid, negative tone photoresist is applied thereto in accordance to the preferred embodiments of the present invention.

FIG. 4C is a partial, sectional view of the PWB stage shown in FIG. 4B after having been exposed and developed to form plated-through-hole (PTH) plugs of varying depths in the through-holes of the PWB in accordance with the preferred embodiments of the present invention.

FIG. 4D is a partial, sectional view of the PWB stage shown in FIG. 4C after a seed photoresist is applied thereto, exposed, and then developed to open up the through-holes for subsequent seed material application in accordance to the preferred embodiments of the present invention.

FIG. 4E is a partial, sectional view of the PWB stage shown in FIG. 4D after seed material is applied thereto in accordance with the preferred embodiments of the present invention.

FIG. 4F is a partial, sectional view of the PWB stage shown in FIG. 4E after the seed photoresist and the PTH plugs are stripped therefrom in accordance with the preferred embodiments of the present invention.

FIG. 4G is a partial, sectional view of the PWB stage shown in FIG. 4F after vias are plated onto the seed material remaining thereon in accordance with the preferred embodiments of the present invention. FIG. 4G illustrates a final PWB stage of the successive stages in the second exemplary method of fabricating one or more stub-less vias in a PWB illustrated in FIGS. 4A-4G.

DETAILED DESCRIPTION OF THE PREFERRED EMBODIMENTS 1.0 Overview

In accordance with the preferred embodiments of the present invention, a substrate (e.g. a printed wiring board or other substrate, such as an interconnect substrate) includes a plurality of insulator layers and internal conductive traces. First and second through-holes extend completely through the substrate and respectively pass through first and second ones of the internal conductive traces, which are at different depths within the substrate. Photolithographic techniques are used to generate plated-through-hole (PTH) plugs of controlled, variable depth in the through-holes before first and second conductive vias are respectively plated onto the first and second through-holes. The depth of these PTH plugs is controlled to prevent the first and second conductive vias from extending substantially beyond the first and second internal conductive traces, respectively, and thereby prevent via stubs from being formed in the first place. This advantageously eliminates the costly and time consuming process of via stub backdrilling.

In one embodiment, the depth of the PTH plugs is controlled through the use of a photomask in combination with a liquid, positive tone photoresist with which the through-holes are filled. Exposure attenuation elements of a variable neutral density pattern of the photomask are registered and control exposure depth on a hole-by-hole basis.

In another embodiment, the depth of the PTH plugs is controlled through the use of variable laser power in combination with the use of a liquid, negative tone photoresist with which the through-holes are filled. Exposure depth is controlled on a hole-by-hole basis by varying the laser power directed toward the through-holes.

2.0 Detailed Description

With reference to the figures and in particular FIGS. 3A-3H, there are depicted, in partial sectional views, successive stages in a first exemplary method of fabricating one or more stub-less vias in a printed wiring board (PWB) in accordance with the preferred embodiments of the present invention. FIGS. 3A-3H set forth the preferred order of the stages in this first exemplary fabrication method. FIGS. 4A-4G, described below, set forth the preferred order of the stages in a second exemplary fabrication method. In each case, however, it must be understood that the various stages may occur at any time relative to one another in accordance with the preferred embodiments of the present invention.

Figure 3A:
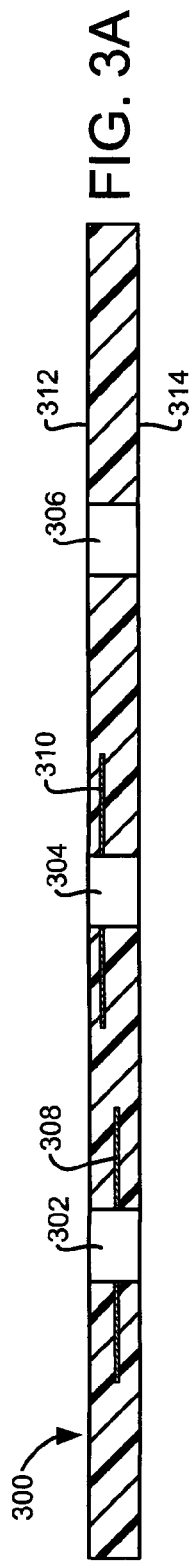

FIG. 3A illustrates an initial stage in the first exemplary method of fabricating one or more stub-less vias in a PWB in accordance with the preferred embodiments of the present invention. FIG. 3A is a partial, sectional view of an exemplary PWB 300 having a plurality of through-holes, such as through-holes 302, 304 and 306, extending completely through the PWB 300. Printed wiring boards are also known as printed circuit boards (PCBs). As is conventional, the PWB 300 includes a plurality of insulator layers (not shown) that separate a plurality of internal conductive traces, such as internal conductive traces 308 and 310. The insulator layers may be, for example, FR-4 (i.e., composite laminate of a resin epoxy reinforced with a woven fiberglass mat) or other suitable organic or inorganic dielectric materials. Typically, such dielectric materials include epoxy resins, ceramics, polyphenylene oxide (PPO)/triallyisocyanurate (TAIC) blends, and perfluorinated or chlorinated materials. The internal conductive traces 308 and 310 may be, for example, copper or other suitable electrically conductive material.

One skilled in the art will appreciate that the PWB 300 shown in FIG. 3A is exemplary. In general, a PWB may contain any number and/or configuration of through-holes, internal conductive traces, and insulator layers. The present invention may be utilized in the context of any PWB or other substrate, such as an interconnect substrate (e.g., an interposer or a module substrate) or a flex cable.

In the exemplary PWB 300 shown in FIG. 3A, the internal conductive trace 308 is deeper (with respect to a surface 312 of the PWB 300) than internal conductive trace 310. That is, the internal conductive trace 308 is nearer to a surface 314 of the PWB 300 than is the internal conductive trace 310. Also, in the exemplary PWB 300 shown in FIG. 3A, the through-hole 302 passes through the internal conductive trace 308, while the through-hole 304 passes through the internal conductive trace 310. Ultimately, in accordance with the preferred embodiments of the present invention, electrical connection will be established in through-hole 302 between a contact pad on the surface 312 of the PWB 300 and the internal conductive trace 308 by a stub-less via 354, as well as in through-hole 304 between a contact pad on the surface 312 of the PWB 300 and the internal conductive trace 310 by a stub-less via 356, shown and described below with reference to FIG. 3H.

Figure 3B:
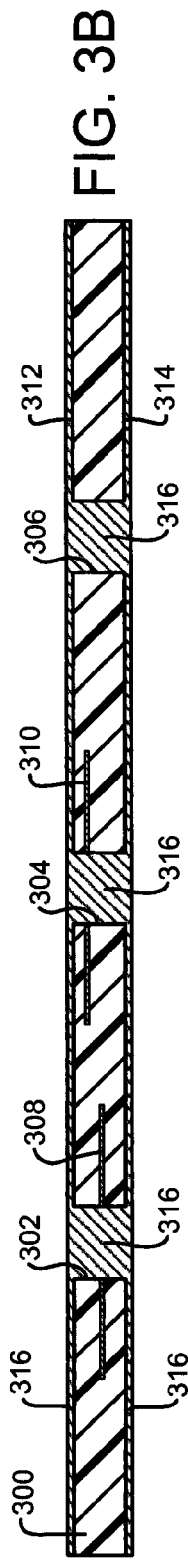

FIG. 3B is a partial, sectional view of the PWB stage shown in FIG. 3A after a liquid, positive tone photoresist 316 is applied thereto in accordance to the preferred embodiments of the present invention. The liquid, positive tone photoresist 316 covers the surface 312 and the surface 314 of the PWB 300, and fills the through-holes 302, 304 and 306 of the PWB 300. The liquid, positive tone photoresist 316 is "positive tone" in that its solubility in a developer increases upon exposure to UV light or other light at the appropriate wavelength for the chosen photoresist. Typically, light exposure causes carboxylic acids to form in the exposed portions of the photoresist, which are then removed, using a developer (e.g. an aqueous alkaline solution). A suitable example of a liquid, positive tone photoresist is "Shin-Etsu MicroSi SIPR 7120/7121" available from Shin-Etsu MicroSI, Phoenix, Ariz. Other suitable examples include positive tone diazo compounds, such as Diazos "PW 205", "PW 1093", "PW 1160", and "PW 2484" available from AZ Electronic Materials (Germany) GmbH, Wiesbaden, Germany. These diazo compounds include 2-Diazo-1-naphthalene-5-sulfoester and/or 2-Diazo-1-naphthalene-4-sulfoester with 2,3,4-Trishydroxybenzophenone, Novolac cresole resins or p-Cumylphenol.

Figure 3C:
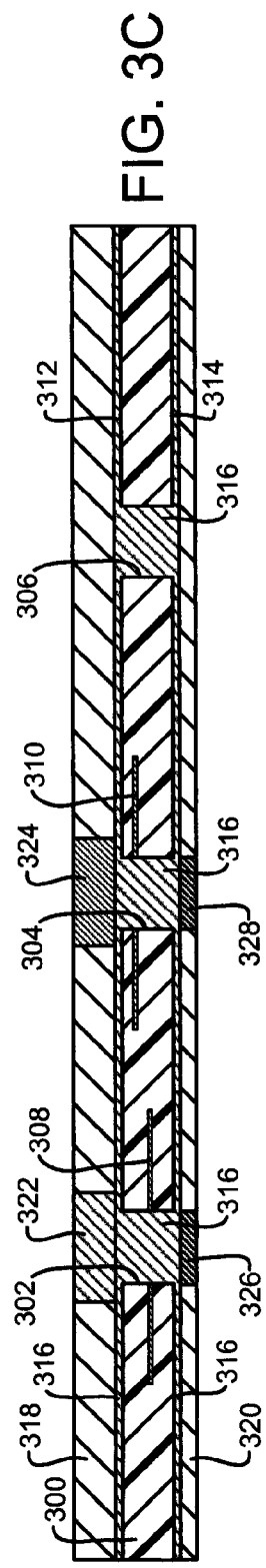

FIG. 3C is a partial, sectional view of the PWB stage shown in FIG. 3B after photomasks 318 and 320 are placed over upper and lower surfaces thereof, respectively, in accordance with the preferred embodiments of the present invention. The upper photomask 318, which is preferably either glass or film, includes a variable neutral density pattern to accommodate the depth of the internal conductive trace to which electrical connection is required. For example, the variable neutral density pattern of the upper photomask 318 includes a plurality of exposure attenuation elements 322 and 324 that are respectively registered with through-holes 302 and 304. The exposure attenuation element 322 has a "lesser" light attenuation (as compared to a "greater" light attenuation of the exposure attenuation element 324) which accommodates the depth of the internal conductive trace 308, to which electrical connection is required in through-hole 302. Conversely, the "greater" light attenuation of the exposure attenuation element 324 accommodates the depth of the internal conductive trace 310, to which electrical connection is required in through-hole 304.

Hence, the "top-side" exposure of the liquid, positive tone photoresist 316 through the exposure attenuation element 322 is greater than through the exposure attenuation element 324 and, consequently, the liquid, positive tone photoresist 316 in the through-hole 302 is exposed to a greater depth than the liquid, positive tone photoresist 316 in the through-hole 304. Preferably, the liquid, positive tone photoresist 316 in the through-hole 302 is exposed to a depth substantially corresponding to or slightly beneath the internal conductive trace 308, while the liquid, positive tone photoresist 316 in the through-hole 304 is exposed to a depth substantially corresponding to or slightly beneath the internal conductive trace 310. Because the solubility of the liquid, positive tone photoresist 316 increases with light exposure, and because the liquid, positive tone photoresist 316 in the through-hole 302 is exposed to a greater depth than the liquid, positive tone photoresist 316 in the through-hole 304, after the photomask covered and photoresist laden PWB is exposed and developed, as described in more detail below with reference to FIG. 3D, the unexposed liquid, positive tone photoresist 316 remaining in the through-holes 302 and 304 will respectively form plated-through-hole (PTH) plugs 330 and 332 at depths in the through-holes 302 and 304 corresponding to or slightly beneath the internal conductive trace 308 and the internal conductive trace 310, respectively.

In general, top-side exposure of the liquid, positive tone photoresist 316 is only attenuated, to any significant extent, by the exposure attenuation elements in accordance with the preferred embodiments of the present invention. That is, portions of the upper photomask 318 that do not include the variable neutral density pattern's exposure attenuation elements do not significantly attenuate top-side exposure of the underlying liquid, positive tone photoresist 316.

Preferably, the width of each of the exposure attenuation elements (e.g., the exposure attenuation elements 322 and 324) is slightly greater than the width of the underlying through-hole (e.g., the through-holes 302 and 304) to substantially prevent unintended overexposure of the liquid, positive tone photoresist 316 in the underlying through-hole. This prevents light from entering the underlying through-hole at an angle from the edge of the exposure attenuation elements.

In accordance with the preferred embodiments of the present invention, the variable neutral density pattern of the upper photomask 318 does not include exposure attenuation elements for registration with through-holes, such as the through-hole 306, that require a conventional plated-through-hole (PTH). Hence, top-side exposure of the liquid, positive tone photoresist 316 in the through-hole 306 is not attenuated by the upper photomask 318. Ultimately, in accordance with the preferred embodiments of the present invention, electrical connection will be established in through-hole 306 between a contact pad on the surface 312 and a contact pad on the surface 314 of the PWB 300 by via 358, shown and described below with reference to FIG. 3H.

The lower photomask 320, which is preferably either glass or film, includes a neutral density pattern to substantially prevent "bottom-side" exposure of the liquid, positive tone photoresist 316 in through-holes, such as the through-holes 302 and 304, in which stub-less vias are to be provided in accordance with the preferred embodiment of the present invention. For example, the neutral density pattern of the lower photomask 320 includes a plurality of exposure blocking elements 326 and 328 that are respectively registered with through-holes 302 and 304.

In general, bottom-side exposure of the liquid, positive tone photoresist 316 is only attenuated, to any significant extent, by the exposure blocking elements in accordance with the preferred embodiments of the present invention. That is, portions of the lower photomask 320 that do not include the neutral density pattern's exposure blocking elements do not significantly attenuate bottom-side exposure of the underlying liquid, positive tone photoresist 316.

Preferably, the width of each of the exposure blocking elements (e.g., the exposure blocking elements 326 and 328) is substantially equal to the width of the underlying through-hole (e.g., the through-holes 302 and 304).

In accordance with the preferred embodiments of the present invention, the neutral density pattern of the lower photomask 320 does not include exposure blocking elements for registration with through-holes, such as the through-hole 306, that require a conventional plated-through-hole (PTH). Hence, bottom-side exposure of the liquid, positive tone photoresist 316 in the through-hole 306 is not attenuated by the lower photomask 320. Ultimately, as mentioned earlier, in accordance with the preferred embodiments of the present invention, electrical connection will be established in through-hole 306 between a contact pad on the surface 312 and a contact pad on the surface 314 of the PWB 300 by via 358, shown and described below with reference to FIG. 3H.

Preferably, the variable neutral density pattern of the upper photomask 318 and the neutral density pattern of the lower photomask 320 are each "neutral" with respect to wavelength of the exposure light. Photomasks suitable for use as the photomasks 318 and 320 are conventional. Typically, a (variable) neutral density pattern is printed on film or a glass plate. For example, "Transmission Step Wedges" available from Stouffer Industries, Inc., Mishawaka, Ind. are representative examples of a neutral density photomask.

Figure 3D:
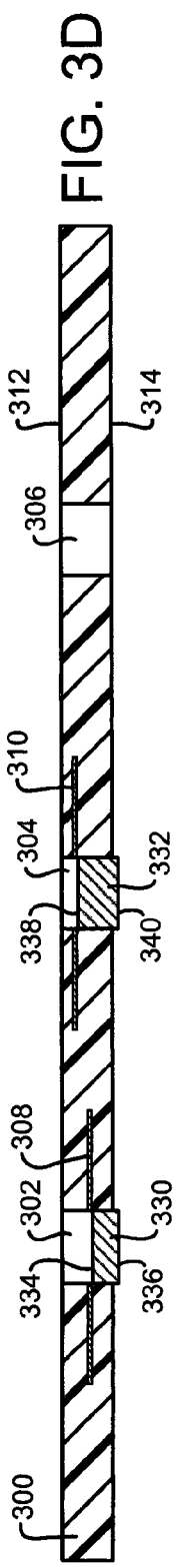

FIG. 3D is a partial, sectional view of the PWB stage shown in FIG. 3C after having been exposed and developed to form plated-through-hole (PTH) plugs (e.g., the PTH plugs 330 and 332) of varying depths in the through-holes (e.g., the through-holes 302 and 304) of the PWB 300 in accordance with the preferred embodiments of the present invention. For example, after the photomask covered and photoresist laden PWB shown in FIG. 3C is exposed and developed, the PTH plug 330 is formed at a depth in the through-hole 302 substantially corresponding to or slightly beneath the internal conductive trace 308, while the PTH plug 332 is formed at a depth in the through-hole 304 substantially corresponding to or slightly beneath the internal conductive trace 310.

Exposure renders the liquid, positive tone photoresist 316 soluble in the developer. The liquid, positive tone photoresist 316 is developed with a developer according to the photoresist manufacturer's instructions. Typically, the developer is an aqueous media, such as an aqueous alkaline solution. Depending on the degree of attenuation provided by the exposure attenuation elements, the PTH plugs of varying depths are formed in the through-holes by the liquid, positive tone photoresist 316 that remains insoluble in the developer. For example, the unexposed liquid, positive tone photoresist 316 remaining in the through-holes 302 and 304 will respectively form PTH plugs 330 and 332 at depths in the through-holes 302 and 304 corresponding to or slightly beneath the internal conductive trace 308 and the internal conductive trace 310, respectively.

The PTH plug 330 formed in the through-hole 302 extends from an upper end 334 thereof at or adjacent to (preferably, slightly beneath) the internal conductive trace 308 to a lower end 336 thereof at or adjacent to (preferably, slightly beneath) the surface 314 of the PWB 300. The PTH plug 332 formed in the through-hole 304 extends from an upper end 338 thereof at or adjacent to (preferably, slightly beneath) the internal conductive trace 310 to a lower end 340 thereof at or adjacent to (preferably, slightly beneath) the surface 314 of the PWB 300.

FIG. 3E is a partial, sectional view of the PWB stage shown in FIG. 3D after a seed photoresist 342 is applied thereto, exposed, and then developed to open up the through-holes for subsequent seed material application (shown and described below with reference to FIG. 3F) in accordance to the preferred embodiments of the present invention. Preferably, the seed photoresist 342 is a conventional dry film, negative tone photoresist. The seed photo resist 342 is preferably "negative tone" in that its solubility in developer (e.g., an aqueous media) decreases upon exposure to light. Representative examples of suitable conventional dry film photoresists include any of the Dupont™ Riston® dry film photoresists available from Dupont Electronic Technologies, Research Triangle Park, North Carolina.

The seed photoresist is developed with a developer according to the photoresist manufacturer's instructions. Typically, the developer is an aqueous media.

As shown in FIG. 3E, the seed photoresist 342 covers the surface 312 and the surface 314 of the PWB 300 except where the seed photoresist has been exposed and developed to open up the through-holes 302, 304 and 306 of the PWB 300. For example, the seed photoresist 342 has open regions 344, 346 and 348 on the surface 312 of the PWB 300 immediately adjacent to and surrounding the through-holes 302, 304 and 306, respectively. Similarly, the seed photoresist 342 has an open region 350 on the surface 314 of the PWB 300 immediately adjacent to and surrounding the through-hole 306. Ultimately, in accordance with the preferred embodiments of the present invention, these open regions 344, 346, 348 and 350 on the surface 312 and the surface 314 of the PWB 300 define the width of a contact pad portion of each of the vias 354, 356 and 358 (shown and described below with reference to FIG. 3H), which are to be formed in the through-holes 302, 304 and 306, respectively.

The seed photoresist must be removed to a sufficient extent from the critical surfaces of the PWB 300 (i.e., the walls of the through-holes 302, 304 and 306 at varying depths, the open regions 344, 346 and 348 on the surface 312, and the open region 350 on the surface 314) to provide for an effective subsequent application of the seed material (shown and described below with reference to FIG. 3F) to those critical surfaces in accordance with the preferred embodiments of the present invention. Because the seed photoresist is preferably "negative tone" (i.e., its solubility in the developer decreases upon exposure to light due to polymerization of the exposed photoresist), only seed photoresist that covers the non-critical surfaces of the PWB is to be exposed to UV light or other light at the appropriate wavelength for the chosen photoresist. The seed photoresist that covers the non-critical surfaces of the PWB corresponds to the seed photoresist 342 shown in FIG. 3E.

Conventional photolithographic techniques may be used to expose and develop the seed photoresist to open up the through-holes for subsequent seed material application (shown and described below with reference to FIG. 3F) in accordance to the preferred embodiments of the present invention. For example, a photomask with art work (not shown) may be employed to prevent exposure of the seed photoresist that covers the critical surfaces of the PWB and allow exposure of the seed photoresist that covers the non-critical surfaces of the PWB. The seed photoresist that covers the non-critical surfaces of the PWB is polymerized by exposure to light. The seed photoresist is then developed using a developer, that is, a solvent which dissolves the unexposed portions of the seed photoresist and leaves the polymerized portions of the seed photoresist. The remaining seed photoresist corresponds to the seed photoresist shown in FIG. 3E.

FIG. 3F is a partial, sectional view of the PWB stage shown in FIG. 3E after seed material 352 is applied thereto in accordance with the preferred embodiments of the present invention. The seed material 352 is denoted as a thick black line in FIG. 3F. Preferably, the seed material 352 preferentially adheres to the PWB 300 and can be relatively easily removed with the seed photoresist 342 and the PTH plugs 330 and 332 (which are made from the liquid, positive tone photoresist 316). The seed material 352 is a conventional seeding composition such as a seeding composition containing palladium chloride, HCl, and stannous chloride. For example, U.S. Pat. No. 4,448,804 to Amelio et al., issued May 15, 1984, describes a preferred seeding composition containing palladium chloride, HCl and stannous chloride and is incorporated herein by reference.

The critical surfaces of the PWB 300 (i.e., the walls of the through-holes 302, 304 and 306 at varying depths, the open regions 344, 346 and 348 on the surface 312, and the open region 350 on the surface 314) are activated, that is seeded, by contact with the seed material 352. The seed material 352 catalyzes the subsequent electroless copper deposition of vias to the critical surfaces of the PWB 300. For example, electroless copper deposition of vias 354, 356 and 358 (shown and described below with reference to FIG. 3H) at the through-holes 302, 304 and 306, respectively, is catalyzed by the seed material 352.

FIG. 3G is a partial, sectional view of the PWB stage shown in FIG. 3F after the seed photoresist 342 and the PTH plugs 330 and 332 (which are made from the liquid, positive tone photoresist 316) are stripped therefrom in accordance with the preferred embodiments of the present invention. The PTH plugs 330 and 332 (liquid, positive tone photoresist 316) may be stripped, for example, by exposing the PTH plugs 330 and 332 to light and then developing the exposed PTH plugs 330 and 332, preferably, using the same developer used earlier. Preferably, the PTH plugs 330 and 332 may be stripped using the manufacturer's recommended stripping solution. The seed photoresist 342, which was earlier polymerized, may be stripped using a stripping solvent according to the photoresist manufacturer's instructions. Stripping the seed photoresist 342 and the liquid, positive tone photoresist 316 leaves the patterned seed material 352 only on the critical surfaces of the PWB 300 (i.e., the walls of the through-holes 302, 304 and 306 at varying depths, the open regions 344, 346 and 348 on the surface 312, and the open region 350 on the surface 314). That is, the patterned seed material 352 remains on the PWB 300 in a pattern that corresponds to the desired stub-less via pattern.

FIG. 3H is a partial, sectional view of the PWB stage shown in FIG. 3G after vias 354, 356 and 358 are plated onto the patterned seed material 352 remaining on the PWB 300 in accordance with the preferred embodiments of the present invention. FIG. 3H illustrates a final PWB stage of the successive stages in the first exemplary method of fabricating one or more stub-less vias in a PWB illustrated in FIGS. 3A-3H. The vias 354, 356 and 358 are formed by contacting the PWB 300 with a conventional electroless plating bath, preferably a copper plating bath. The PWB 300 is then removed from the bath. The metal is thus plated onto the patterned seed material 352 in the desired stub-less via pattern. All the seed material 352 is covered by the electrolessly plated metal; no unplated seed material 352 exists on the PWB 300 after the electroless plating step.

Alternatively, the vias 354, 356 and 358 may be electroplated onto the patterned seed material 352 using a conventional electrolytic deposition process in lieu of utilizing an electroless plating bath.

The plating process results in either a partially-plated-hole via (e.g., stub-less vias 354 and 356) or a completely-plated-hole via (e.g., PTH via 358). The stub-less via 354 extends from a contact-pad-portion on the surface 312 of the PWB 300 to and terminates in an edge substantially at the internal conductive trace 308. The stub-less via 356 extends from a contact-pad-portion on the surface 312 of the PWB 300 to and terminates in an edge substantially at the internal conductive trace 310. The PTH via 358 extends from a contact-pad-portion on the surface 312 of the PWB 300 to a contact-pad-portion on the surface 314 of the PWB 300.

With reference to the figures and in particular FIGS. 4A-4G, there are depicted, in partial sectional views, successive stages in a second exemplary method of fabricating one or more stub-less vias in a printed wiring board (PWB) in accordance with the preferred embodiments of the present invention. FIGS. 4A-4G set forth the preferred order of the stages in the second exemplary fabrication method. It must be understood, however, that the various stages may occur at any time relative to one another in accordance with the preferred embodiments of the present invention.

FIG. 4A illustrates an initial stage in the second exemplary method of fabricating one or more stub-less vias in a PWB in accordance with the preferred embodiments of the present invention. FIG. 4A is a partial, sectional view of an exemplary PWB 400 having a plurality of through-holes, such as through-holes 402, 404 and 406, extending completely through the PWB 400. Printed wiring boards are also known as printed circuit boards (PCBs). As is conventional, the PWB 400 includes a plurality of insulator layers (not shown) that separate a plurality of internal conductive traces, such as internal conductive traces 408 and 410. The insulator layers may be, for example, FR-4 (i.e., composite laminate of a resin epoxy reinforced with a woven fiberglass mat) or other suitable organic or inorganic dielectric materials. Typically, such dielectric materials include epoxy resins, ceramics, polyphenylene oxide (PPO)/triallyisocyanurate (TAIC) blends, and perfluorinated or chlorinated materials. The internal conductive traces 408 and 410 may be, for example, copper or other suitable electrically conductive material.

One skilled in the art will appreciate that the PWB 400 shown in FIG. 4A is exemplary. In general, a PWB may contain any number and/or configuration of through-holes, internal conductive traces, and insulator layers. The present invention may be utilized in the context of any PWB or other substrate, such as an interconnect substrate (e.g., an interposer or a module substrate) or a flex cable.

In the exemplary PWB 400 shown in FIG. 4A, the internal conductive trace 408 is deeper (with respect to a surface 412 of the PWB 400) than internal conductive trace 410. That is, the internal conductive trace 408 is nearer to a surface 414 of the PWB 400 than is the internal conductive trace 410. Also, in the exemplary PWB 400 shown in FIG. 4A, the through-hole 402 passes through the internal conductive trace 408, while the through-hole 404 passes through the internal conductive trace 410. Ultimately, in accordance with the preferred embodiments of the present invention, electrical connection will be established in through-hole 402 between a contact pad on the surface 412 of the PWB 400 and the internal conductive trace 408 by a stub-less via 454, as well as in through-hole 404 between a contact pad on the surface 412 of the PWB 400 and the internal conductive trace 410 by a stub-less via 456, shown and described below with reference to FIG. 4G.

The PWB 400 shown in FIG. 4A is identical to the PWB 300 shown in FIG. 3A except that the latter is illustrated "upside-down" with respect to the former. The PWB 400 in FIGS. 4A-4G was flipped with respect to the PWB 300 in FIG. 3A-3H so that both of these exemplary methods are illustrated with "top-side" control of the exposure depth of the PTH plugs formed therein (i.e., the exposure depth is controlled from the "upper" surface 414 of the PWB 400 in FIG. 4B, while the exposure depth is controlled from "upper" surface 312 of the PWB 300 in FIG. 3C).

FIG. 4B is a partial, sectional view of the PWB stage shown in FIG. 4A after a liquid, negative tone photoresist 416 is applied thereto in accordance to the preferred embodiments of the present invention. The liquid, negative tone photoresist 416 covers the surface 414 of the PWB 400, and fills the through-holes 402, 404 and 406 of the PWB 400. The liquid, negative tone photoresist 416 is "negative tone" in that its solubility in a developer decreases upon exposure to UV light or other light at the appropriate wavelength for the chosen photoresist. Typically, light exposure causes the photoresist to cross-link becoming insoluble in the developer (e.g. an aqueous solution).

Preferably, the liquid, negative tone photoresist 416 is an SLA (stereolithography apparatus) resin. Stereolithography is an additive fabrication process that uses a liquid, negative tone photoresist (commonly referred to as an "SLA resin") and a UV laser (commonly referred to as an "SLA laser") to build parts layer-upon-layer. Stereolithography is typically used for either rapid prototyping or rapid manufacturing. The device that performs stereolithography is called an "SLA" or "stereolithography apparatus." In the second exemplary method shown in FIGS. 4A-4G, a conventional SLA laser is used in conjunction with a conventional SLA resin to form the PTH plugs. The exposure depth can be adjusted on a hole-by-hole basis by varying the power of the SLA laser, thus obviating the need for a photomask (i.e., no photomask analogous to the photomask 318 in FIG. 3C is needed to form the PTH plugs). One skilled in the art will appreciate, however, that in lieu of or in addition to varying the power of the conventional SLA laser, a photomask may be used in conjunction with the conventional SLA resin or other liquid, negative tone photoresist.

A suitable example of an SLA resin for use as the liquid, negative tone photoresist 416 is "RenShape SL 5530", available from Huntsman Advanced Materials Americas Inc., Auburn Hills, Mich. Another suitable example of an SLA resin for use as the liquid, negative tone photoresist 416 is "WaterClear® Ultra 10122", available from DSM Somos®, Elgin, Ill.

The "top-side" exposure of the liquid, negative tone photoresist 416 is controlled by varying the power of the SLA laser on a hole-by-hole basis and, consequently, the liquid, negative tone photoresist 416 in the through-hole 402 is exposed to a lesser depth (with respect to the surface 414) than the liquid, negative tone photoresist 416 in the through-hole 404. Preferably, the liquid, negative tone photoresist 416 in the through-hole 402 is exposed to a depth substantially corresponding to or slightly above the internal conductive trace 408, while the liquid, negative tone photoresist 416 in the through-hole 404 is exposed to a depth substantially corresponding to or slightly above the internal conductive trace 410. Because the solubility of the liquid, negative tone photoresist 416 decreases with light exposure, and because the liquid, negative tone photoresist 416 in the through-hole 402 is exposed to a shallower depth than the liquid, negative tone photoresist 416 in the through-hole 404, after the photoresist laden PWB is exposed and developed, as described in more detail below with reference to FIG. 4C, the unexposed liquid, negative tone photoresist 416 remaining in the through-holes 402 and 404 will respectively form plated-through-hole (PTH) plugs 430 and 432 at depths in the through-holes 402 and 404 corresponding to or slightly above the internal conductive trace 408 and the internal conductive trace 410, respectively.

In accordance with the preferred embodiments of the present invention, the SLA laser does not expose through-holes, such as the through-hole 406, that require a conventional plated-through-hole (PTH). Hence, the liquid, negative tone photoresist 416 in the through-hole 406 is unexposed to UV light from the SLA laser. Ultimately, in accordance with the preferred embodiments of the present invention, electrical connection will be established in through-hole 406 between a contact pad on the surface 412 and the surface 414 of the PWB 400 by via 458, shown and described below with reference to FIG. 4G.

FIG. 4C is a partial, sectional view of the PWB stage shown in FIG. 4B after having been exposed and developed to form plated-through-hole (PTH) plugs (e.g., the PTH plugs 430 and 432) of varying depths in the through-holes (e.g., the through-holes 402 and 404) of the PWB 400 in accordance with the preferred embodiments of the present invention. For example, after the photoresist laden PWB shown in FIG. 4B is exposed and developed, the PTH plug 430 is formed at a depth in the through-hole 402 substantially corresponding to or slightly above the internal conductive trace 408, while the PTH plug 432 is formed at a depth in the through-hole 404 substantially corresponding to or slightly above the internal conductive trace 410.

Exposure renders the liquid, negative tone photoresist 416 insoluble in the developer. The liquid, negative tone photoresist 416 is developed with a developer according to the photoresist manufacturer's instructions. Typically, the developer is an aqueous media. Depending on the power of the SLA laser, the PTH plugs of varying depths are formed in the through-holes by the liquid, negative tone photoresist 416 that is exposed and becomes insoluble in the developer. For example, the exposed liquid, negative tone photoresist 416 remaining in the through-holes 402 and 404 will respectively form PTH plugs 430 and 432 at depths in the through-holes 402 and 404 corresponding to or slightly above the internal conductive trace 408 and the internal conductive trace 410, respectively.

The PTH plug 430 formed in the through-hole 402 extends from a lower end 434 thereof at or adjacent to (preferably, slightly above) the internal conductive trace 408 to an upper end 436 thereof at or adjacent to (preferably, slightly above) the surface 414 of the PWB 400. The PTH plug 432 formed in the through-hole 404 extends from a lower end 438 thereof at or adjacent to (preferably, slightly above) the internal conductive trace 410 to an upper end 440 thereof at or adjacent to (preferably, slightly above) the surface 414 of the PWB 400.

FIG. 4D is a partial, sectional view of the PWB stage shown in FIG. 4C after a seed photoresist 442 is applied thereto, exposed, and then developed to open up the through-holes for subsequent seed material application (shown and described below with reference to FIG. 4E) in accordance to the preferred embodiments of the present invention. Preferably, the seed photoresist 442 is a conventional dry film, negative tone photoresist. The seed photo resist 442 is preferably "negative tone" in that its solubility in developer (e.g., an aqueous media) decreases upon exposure to light. Representative examples of suitable conventional dry film photoresists include any of the Dupont™ Riston® dry film photoresists available from Dupont Electronic Technologies, Research Triangle Park, North Carolina.

The seed photoresist is developed with a developer according to the photoresist manufacturer's instructions. Typically, the developer is an aqueous media.

As shown in FIG. 4D, the seed photoresist 442 covers the surface 412 and the surface 414 of the PWB 400 except where the seed photoresist has been exposed and developed to open up the through-holes 402, 404 and 406 of the PWB 400. For example, the seed photoresist 442 has open regions 444, 446 and 448 on the surface 412 of the PWB 400 immediately adjacent to and surrounding the through-holes 402, 404 and 406, respectively. Similarly, the seed photoresist 442 has an open region 450 on the surface 414 of the PWB 400 immediately adjacent to and surrounding the through-hole 406. Ultimately, in accordance with the preferred embodiments of the present invention, these open regions 444, 446, 448 and 450 on the surface 412 and the surface 414 of the PWB 400 define the width of a contact-pad-portion of each of the vias 454, 456 and 458 (shown and described below with reference to FIG. 4G), which are to be formed in the through-holes 402, 404 and 406, respectively.

The seed photoresist must be removed to a sufficient extent from the critical surfaces of the PWB 400 (i.e., the walls of the through-holes 402, 404 and 406 at varying depths, the open regions 444, 446 and 448 on the surface 412, and the open region 450 on the surface 414) to provide for an effective subsequent application of the seed material (shown and described below with reference to FIG. 4E) to those critical surfaces in accordance with the preferred embodiments of the present invention. Because the seed photoresist is preferably "negative tone" (i.e., its solubility in developer decreases upon exposure to light due to polymerization of the exposed photoresist), only seed photoresist that covers the non-critical surfaces of the PWB is to be exposed to UV light or other light at the appropriate wavelength for the chosen photoresist. The seed photoresist that covers the non-critical surfaces of the PWB corresponds to the seed photoresist 442 shown in FIG. 4D.

Conventional photolithographic techniques may be used to expose and develop the seed photoresist to open up the through-holes for subsequent seed material application (shown and described below with reference to FIG. 4E) in accordance to the preferred embodiments of the present invention. For example, a photomask with art work (not shown) may be employed to prevent exposure of the seed photoresist that covers the critical surfaces of the PWB and allow exposure of the seed photoresist that covers the non-critical surfaces of the PWB. The seed photoresist that covers the non-critical surfaces of the PWB is polymerized by exposure to light. The seed photoresist is then developed using a developer, that is, a solvent which dissolves the unexposed portions of the seed photoresist and leaves the polymerized portions of the seed photoresist. The remaining seed photoresist corresponds to the seed photoresist shown in FIG. 4D.

FIG. 4E is a partial, sectional view of the PWB stage shown in FIG. 4D after seed material 452 is applied thereto in accordance with the preferred embodiments of the present invention. The seed material 452 is denoted as a thick black line in FIG. 4E. Preferably, the seed material 452 preferentially adheres to the PWB 400 and can be relatively easily removed with the seed photoresist 442 and the PTH plugs 430 and 432 (which are made from the exposed and cross-linked liquid, negative tone photoresist 416). The seed material 452 is a conventional seeding composition such as a seeding composition containing palladium chloride, HCl, and stannous chloride. As mentioned above, U.S. Pat. No. 4,448,804 to Amelio et al., issued May 15, 1984, describes a preferred seeding composition containing palladium chloride, HCl and stannous chloride and is incorporated herein by reference.

The critical surfaces of the PWB 400 (i.e., the walls of the through-holes 402, 404 and 406 at varying depths, the open regions 444, 446 and 448 on the surface 412, and the open region 450 on the surface 414) are activated, that is seeded, by contact with the seed material 452. The seed material 452 catalyzes the subsequent electroless copper deposition of vias to the critical surfaces of the PWB 400. For example, electroless copper deposition of vias 454, 456 and 458 (shown and described below with reference to FIG. 4G) at the through-holes 402, 404 and 406, respectively, is catalyzed by the seed material 452.

FIG. 4F is a partial, sectional view of the PWB stage shown in FIG. 4E after the seed photoresist 442 and the PTH plugs 430 and 432 (which are made from the exposed and cross-linked liquid, negative tone photoresist 416) are stripped therefrom in accordance with the preferred embodiments of the present invention. The seed photoresist 442 and PTH plugs 430 and 432 may be stripped using a stripping solvent according to the respective photoresist manufacturer's instructions. Stripping the seed photoresist 442 and the PTH plugs 430 and 432 leaves the patterned seed material 452 only on the critical surfaces of the PWB 400 (i.e., the walls of the through-holes 402, 404 and 406 at varying depths, the open regions 444, 446 and 448 on the surface 412, and the open region 450 on the surface 414). That is, the patterned seed material 452 remains on the PWB 400 in a pattern that corresponds to the desired stub-less via pattern.

FIG. 4G is a partial, sectional view of the PWB stage shown in FIG. 4F after vias 454, 456 and 458 are plated onto the patterned seed material 452 remaining on the PWB 400 in accordance with the preferred embodiments of the present invention. FIG. 4G illustrates a final PWB stage of the successive stages in the second exemplary method of fabricating one or more stub-less vias in a PWB illustrated in FIGS. 4A-4G. The vias 454, 456 and 458 are formed by contacting the PWB 400 with a conventional electroless plating bath, preferably a copper plating bath. The PWB 400 is then removed from the bath. The metal is thus plated onto the patterned seed material 452 in the desired stub-less via pattern. All the seed material 452 is covered by the electrolessly plated metal; no unplated seed material 452 exists on the PWB 400 after the electroless plating step.

Alternatively, the vias 454, 456 and 458 may be electroplated onto the patterned seed material 452 using a conventional electrolytic deposition process in lieu of utilizing an electroless plating bath.

The plating process results in either a partially-plated-hole via (e.g., stub-less vias 454 and 456) or a completely-plated-hole via (e.g., PTH via 458). The stub-less via 454 extends from a contact-pad-portion on the surface 412 of the PWB 400 to and terminates in an edge substantially at the internal conductive trace 408. The stub-less via 456 extends from a contact-pad-portion on the surface 412 of the PWB 400 to and terminates in an edge substantially at the internal conductive trace 410. The PTH via 458 extends from a contact-pad-portion on the surface 412 of the PWB 400 to a contact-pad-portion on the surface 414 of the PWB 400.

Figure 1:
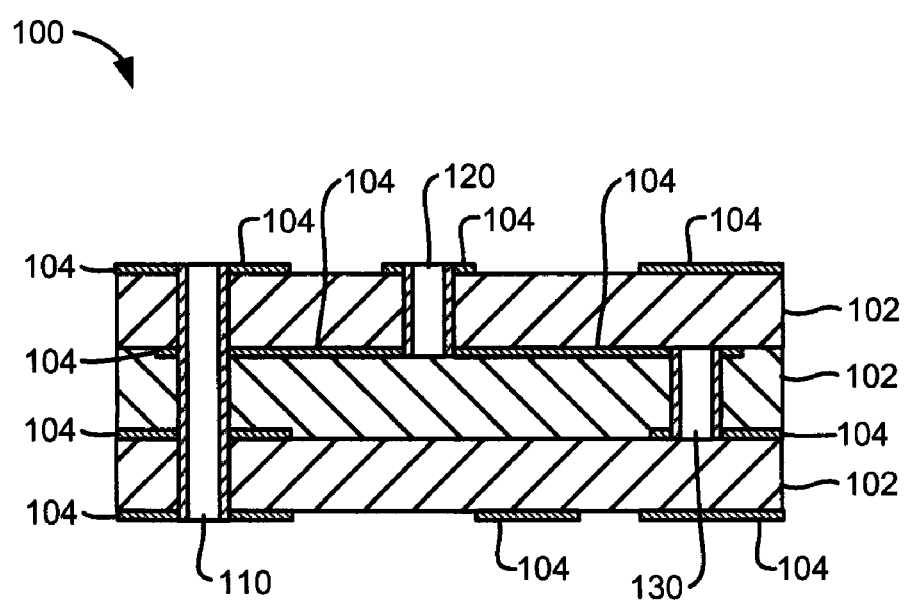
FIG. 1 is a partial, sectional view of a printed wiring board (PWB) having exemplary types of conventional vias, including a plated-through-hole (PTH) via, a blind via and a buried via.
Figure 2:
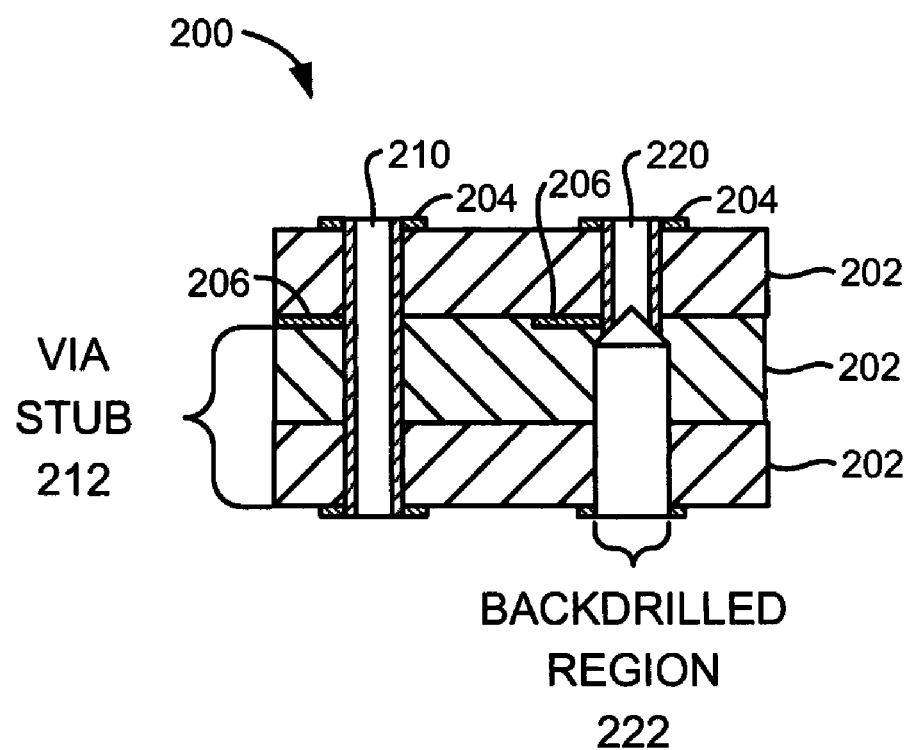
FIG. 2 is partial, sectional view of a printed wiring board (PWB) with an exemplary conventional plated-through-hole (PTH) via having a via stub and an exemplary conventional backdrilled PTH via.

A stub-less via fabricated in accordance with the preferred embodiments of the present invention (e.g., the stub-less vias 354 and 356 shown in FIG. 3H and the stub-less vias 454 and 456 shown in FIG. 4G) terminates in a non-tooled edge substantially at an internal conductive trace (e.g., the internal conductive traces 308 and 310 shown in FIG. 3H and the internal conductive traces 408 and 410 shown in FIG. 4G). A conventional backdrilled via formed by the costly, time-consuming process of backdrilling (e.g., the conventional backdrilled via 220 shown in FIG. 2) likewise terminates substantially at an internal conductive trace (e.g., the intermediate conductive trace 206 shown in FIG. 2), but it terminates in a tooled edge. Thus, a stub-less via fabricated in accordance with the preferred embodiments of the present invention is easily detected because a cross-section of the via structure would reveal a non-tooled edge. A cross-section of a conventional backdrilled via, on the other hand, would reveal a tooled edge that inherently results from the backdrilling process, i.e., the drill bit used in the backdrilling process inherently produces a via edge that is tapered and typically shows signs of metal movement, such as galling.

One skilled in the art will appreciate that many variations are possible within the scope of the present invention. For example, although the preferred embodiments of the present invention are described herein within the context of a printed wiring board (PWB), the present invention may be utilized in the context of other substrates, such as an interconnect substrate (e.g., an interposer or a module substrate) or a flex cable. In addition, although the preferred embodiments of the present invention are described herein within the context of forming one or more stub-less vias on a single side of a substrate, the present invention may be utilized in the context of forming a plurality of stub-less vias that have contact-pad-portions on alternate sides of a substrate. Thus, while the present invention has been particularly shown and described with reference to the preferred embodiments thereof, it will be understood by those skilled in the art that these and other changes in form and detail may be made therein without departing from the spirit and scope of the present invention.

What is claimed is:

1. A method comprising the steps of:
    providing a substrate having a plurality of insulator layers and one or more internal conductive traces, wherein a first through-hole extends completely through the substrate from a first surface of the substrate to a second surface of the substrate, and wherein the first through-hole passes through a first one of the one or more internal conductive traces;
    providing a first plated-through-hole (PTH) plug in the first through-hole, wherein the first PTH plug extends from a second end thereof at or adjacent to the substrate's second surface to a first end thereof at or adjacent to the first internal conductive trace;
    providing a seed photoresist on portions of the substrate's first and second surfaces, wherein the seed photoresist has open regions in the vicinity of the first through-hole, and wherein the open regions of the seed photoresist expose a portion of the substrate's first surface adjacent the first through-hole, a portion of the first through-hole extending from the substrate's first surface to the first internal conductive trace, the first end of the first PTH plug, and the second end of the first PTH plug;
    applying seed material to the seed photoresist, the exposed portion of the substrate's first surface, the exposed portion of the first through-hole, the exposed first end of the first PTH plug, and the exposed second end of the first PTH plug;
    stripping the first PTH plug and the seed photoresist so that the seed material remains substantially only at a portion of the substrate's first surface adjacent the first through-hole and at a portion of the first through-hole extending from the substrate's first surface to the first internal conductive trace;
    plating a first conductive via plating onto the first through-hole so that the first conductive via plating extends from the substrate's first surface to and terminates substantially at the first internal conductive trace.

2. The method as recited in claim 1, wherein the step of plating the first conductive via plating onto the first through-hole includes the step of plating a conductive material onto the portions of the seed material that remain after the stripping step by contacting the substrate with an electroless plating bath.

3. The method as recited in claim 1, wherein the step of providing a first plated-through-hole (PTH) plug in the first through-hole comprises the steps of:
    laminating the substrate's first and second surfaces with a liquid, positive tone photoresist, wherein the liquid, positive tone photoresist substantially fills the first through-hole;
    placing a first photomask over the substrate's first surface laminated with the liquid, positive tone photoresist, wherein the first photomask includes a variable neutral density pattern having a plurality of exposure attenuation elements, and wherein a first one of the exposure attenuation elements of the first photomask is registered with the first through-hole;
    placing a second photomask over the substrate's second surface laminated with the liquid, positive tone photoresist, wherein the second photomask includes a plurality of exposure blocking elements, and wherein a first one of the exposure blocking elements of the second photomask is registered with the first through-hole;
    exposing, through the first photomask and the second photomask, the substrate's first and second surfaces laminated with the liquid, positive tone photoresist.

4. The method as recited in claim 1, wherein the step of providing a first plated-through-hole (PTH) plug in the first through-hole comprises the steps of:
- laminating the substrate's second surface with a liquid, negative tone photoresist, wherein the liquid, negative tone photoresist substantially fills the first through-hole;
- exposing the liquid, negative tone photoresist in the first through-hole to laser light from the direction of the substrate's second surface, wherein the power of the laser light directed into the first through-hole is sufficient to expose the liquid, negative tone photoresist in the first through-hole to a depth at or adjacent to the first internal conductive trace.

5. The method as recited in claim 4, wherein the liquid, negative tone photoresist is an SLA resin and the laser light is provided by an SLA laser.

6. A method comprising the steps of:
- providing a substrate having a plurality of insulator layers and a plurality of internal conductive traces, wherein a plurality of through-holes extend completely through the substrate from a first surface of the substrate to a second surface of the substrate, wherein a first one of the through-holes passes through a first one of the internal conductive traces, wherein a second one of the through-holes passes through a second one of the internal conductive traces, and wherein first internal conductive trace lies deeper within the substrate with respect to the substrate's first surface than does the second internal conductive trace;
- providing a first plated-through-hole (PTH) plug in the first through-hole, wherein the first PTH plug extends from a second end thereof at or adjacent to the substrate's second surface to a first end thereof at or adjacent to the first internal conductive trace;
- providing a second plated-through-hole (PTH) plug in the second through-hole, wherein the second PTH plug extends from a second end thereof at or adjacent to the substrate's second surface to a first end thereof at or adjacent to the second internal conductive trace;
- providing a seed photoresist on portions of the substrate's first and second surfaces, wherein the seed photoresist has open regions in the vicinity of the first and second through-holes, and wherein the open regions of the seed photoresist expose a portion of the substrate's first surface adjacent the first through-hole, a portion of the substrate's first surface adjacent the second through-hole, a portion of the first through-hole extending from the substrate's first surface to the first internal conductive trace, a portion of the second through-hole extending from the substrate's first surface to the second internal conductive trace, the first end of the first and second PTH plugs, and the second end of the first and second PTH plugs;
- applying seed material to the seed photoresist, the exposed portions of the substrate's first surface, the exposed portions of the first and second through-holes, the exposed first end of the first and second PTH plugs, and the exposed second end of the first and second PTH plugs;
- stripping the first and second PTH plugs and the seed photoresist so that the seed material remains substantially only at a portion of the substrate's first surface adjacent the first through-hole, a portion of the first through-hole extending from the substrate's first surface to the first internal conductive trace, a portion of the substrate's first surface adjacent the second through-hole, a portion of the second through-hole extending from the substrate's first surface to the second internal conductive trace;
- plating a first conductive via plating onto the first through-hole so that the first conductive via plating extends from the substrate's first surface to and terminates substantially at the first internal conductive trace;
- plating a second conductive via plating onto the second through-hole so that the second conductive via plating extends from the substrate's first surface to and terminates substantially at the second internal conductive trace.

7. The method as recited in claim 6, wherein the step of plating the first conductive via plating onto the first through-hole and the step of plating the second conductive via plating onto the second through-hole are performed simultaneously and include the step of plating a conductive material onto the portions of the seed material that remain after the stripping step by contacting the substrate with an electroless plating bath.

8. The method as recited in claim 6, wherein the step of providing a first plated-through-hole (PTH) plug in the first through-hole and the step of providing a second plated-through-hole (PTH) plug in the second through-hole are performed substantially simultaneously and comprise the steps of:
- laminating the substrate's first and second surfaces with a liquid, positive tone photoresist, wherein the liquid, positive tone photoresist substantially fills the first and second through-holes;
- placing a first photomask over the substrate's first surface laminated with the liquid, positive tone photoresist, wherein the first photomask includes a variable neutral density pattern having a plurality of exposure attenuation elements, and wherein a first one and a second one of the exposure attenuation elements of the first photomask are respectively registered with the first and the second through-holes;
- placing a second photomask over the substrate's second surface laminated with the liquid, positive tone photoresist, wherein the second photomask includes a plurality of exposure blocking elements, and wherein a first one and a second one of the exposure blocking elements of the second photomask are respectively registered with the first and the second through-holes;
- exposing, through the first photomask and the second photomask, the substrate's first and second surfaces laminated with the liquid, positive tone photoresist.

9. The method as recited in claim 6, wherein the step of providing a first plated-through-hole (PTH) plug in the first through-hole and the step of providing a second plated-through-hole (PTH) plug in the second through-hole comprise the steps of:
- laminating the substrate's second surface with a liquid, negative tone photoresist, wherein the liquid, negative tone photoresist substantially fills the first and second through-holes;
- exposing the liquid, negative tone photoresist in the first through-hole to laser light from the direction of the substrate's second surface, wherein the power of the laser light directed into the first through-hole is sufficient to expose the liquid, negative tone photoresist in the first through-hole to a depth at or adjacent to the first internal conductive trace;

exposing the liquid, negative tone photoresist in the second through-hole to laser light from the direction of the substrate's second surface, wherein the power of the laser light directed into the second through-hole is sufficient to expose the liquid, negative tone photoresist in the second through-hole to a depth at or adjacent to the second internal conductive trace.

10. The method as recited in claim 9, wherein the liquid, negative tone photoresist is an SLA resin and the laser light is provided by an SLA laser.

11. The method as recited in claim 10, wherein the power of the laser light provided by the SLA laser is adjusted on a hole-by-hole basis during the exposing steps.

* * * * *